(12) United States Patent
Yeh et al.

(10) Patent No.: US 9,012,906 B2
(45) Date of Patent: Apr. 21, 2015

(54) THIN FILM TRANSISTOR, ARRAY SUBSTRATE, AND DISPLAY APPARATUS

(71) Applicant: E Ink Holdings Inc., Hsinchu (TW)

(72) Inventors: Chia-Chun Yeh, Hsinchu (TW); Xue-Hung Tsai, Hsinchu (TW); Po-Hsin Lin, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 2 days.

(21) Appl. No.: 13/688,222

(22) Filed: Nov. 29, 2012

(65) Prior Publication Data

US 2014/0084281 A1 Mar. 27, 2014

(30) Foreign Application Priority Data

Sep. 21, 2012 (TW) .............................. 101134794 A

(51) Int. Cl.
*H01L 29/10* (2006.01)
*H01L 29/786* (2006.01)
*H01L 27/15* (2006.01)

(52) U.S. Cl.
CPC .......... *H01L 29/7869* (2013.01); *H01L 27/156* (2013.01); *H01L 29/78696* (2013.01)

(58) Field of Classification Search
CPC .......................... H01L 29/7869; H01L 27/156
USPC ..................................................... 257/43, 66
See application file for complete search history.

(56) References Cited

U.S. PATENT DOCUMENTS

| 2009/0321731 A1 | 12/2009 | Jeong et al. |
| 2010/0176388 A1 | 7/2010 | Ha et al. |
| 2011/0079784 A1 | 4/2011 | Im |
| 2011/0084262 A1 | 4/2011 | Kondratyuk et al. |
| 2011/0198584 A1 | 8/2011 | Yang et al. |
| 2011/0240986 A1 | 10/2011 | Tsai et al. |
| 2011/0303918 A1 | 12/2011 | Im |
| 2012/0313084 A1* | 12/2012 | Tsai et al. ........................ 257/40 |
| 2013/0045567 A1* | 2/2013 | Zan et al. ....................... 438/104 |

* cited by examiner

*Primary Examiner* — Trung Q Dang
(74) *Attorney, Agent, or Firm* — Jianq Chyun IP Office

(57) ABSTRACT

A thin film transistor disposed on a substrate is provided. The TFT includes a gate layer, an insulation layer, a carrier transmission layer, a passivation layer, a first source/drain layer, and a second source/drain layer. The gate layer is disposed on the substrate. The insulation layer is disposed on the gate layer. The carrier transmission layer is disposed on the insulation layer. The carrier transmission layer includes an active layer and a mobility enhancement layer. The passivation layer is disposed on the active layer. The first source/drain layer is disposed on the active layer. The second source/drain layer is disposed on the active layer. The mobility enhancement layer includes a first element. The active layer includes a second element. The electronegativity of the first element is smaller than that of the second element to enhance the carrier mobility of the active layer.

20 Claims, 3 Drawing Sheets

THIN FILM TRANSISTOR, ARRAY SUBSTRATE, AND DISPLAY APPARATUS

CROSS-REFERENCE TO RELATED APPLICATION

This application claims the priority benefit of Taiwan application serial no. 101134794, filed on Sep. 21, 2012. The entirety of the above-mentioned patent application is hereby incorporated by reference herein and made a part of this specification.

BACKGROUND

1. Field of the Invention

The invention relates to a transistor, and more particularly to, a thin film transistor (TFT) adapted to be applied in a display panel.

2. Description of Related Art

A thin film transistor can be roughly categorized into a staggered one and a coplanar one based on the structure layout of the layers thereof. For the staggered thin film transistor, the semiconductor layer is disposed between the gate layer (or the insulation layer) and the source/drain layer thereof; for the coplanar thin film transistor, the source/drain layer is disposed the gate layer (or the insulation layer) and the semiconductor layer thereof. In addition, according to the structure layout of the source/drain layer, the structures of the thin film transistor may generally be categorized into one source/drain structure that contact holes are located at two sides of the thin film transistor and another source/drain structure that the source/drain layers distribute in an island form.

In a fabrication process of the thin film transistor, an active layer thereof is prone to be damaged by a plurality of etching solutions, and therefore, in the device fabrication, an etch stop layer (ESL) structure is mostly been used as a protection when layer etching on the semiconductor. In terms of the protection of an island form etch stop layer, the active layer is also influenced due to the island form etch stop layer during the etching. Therefore, in order to reduce a degree of influence on the active layer, recently an etch stop layer protection method by using contact holes at the two sides above the active layer to contact with the source/drain layer is developed. However, since a contact area of the source/drain layer and active layer of this structure is shrunk, a result thereof causes a reduction in device characteristics. Therefore, if a carrier mobility of the active layer can be enhanced, then the device characteristics may become effective.

SUMMARY OF THE INVENTION

The invention provides a thin film transistor, and an active layer thereof has high carrier mobility.

The invention provides an array substrate, and an active layer of a thin film transistor disposed thereon has high carrier mobility.

The invention provides a display device, and an active layer of a thin film transistor disposed on an array substrate thereof has high carrier mobility.

According to an embodiment of the invention, a thin film transistor adapted to be arranged on a substrate is provided. The thin film transistor includes a gate layer, an insulation layer, a carrier transmission layer, a passivation layer, a first source/drain layer and a second source/drain layer. The gate layer is disposed on the substrate. The insulation layer is disposed on the gate layer. The carrier transmission layer is disposed on the insulation layer. The carrier transmission layer includes an active layer and a mobility enhancement layer. The passivation layer is disposed on the active layer. The first source/drain layer is disposed on the active layer. The second source/drain layer is disposed on the active layer.

According to an embodiment of the invention, an array substrate including a substrate and a plurality of thin film transistors having the above-mentioned structures is provided. The thin film transistors are arranged on the substrate.

According to an embodiment of the invention, a display device including an array substrate, an opposite and a display layer is provided. The array substrate has the above-mentioned substrate and the plurality of thin film transistors having the above-mentioned structures. The thin film transistors are arranged on the array substrate. The opposite substrate is arranged opposite to the array substrate. The display layer is arranged between the array substrate and the opposite substrate.

According to the foregoing, in the embodiments of the invention, a mobility enhancement layer is disposed above or below the active layer of the thin film transistor, so as to enhance the carrier mobility of the thin film transistor.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

How to enhance a carrier mobility of an active layer in a thin film transistor is namely one of the most important concepts of the present disclosure, such that a mobility enhancement layer is being disposed above or below the active layer of the thin film transistor in this disclosure. A low electronegativity element within the mobility enhancement layer may form an element vacancy in the active layer, and thereby enhance a carrier mobility of the device. In order to make the invention more comprehensible, at least one exemplary embodiment accompanied with figures are described in detail below.

Figure 1:
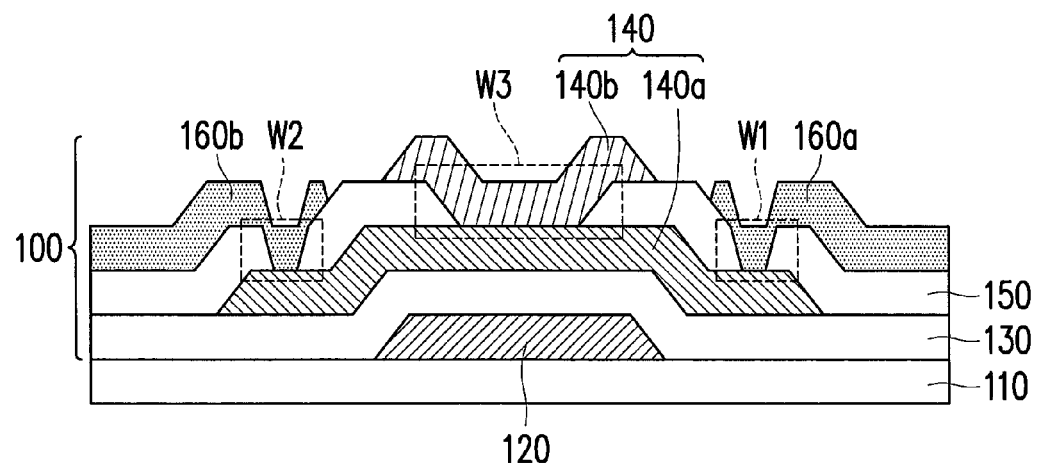
FIG. 1 is a cross-sectional view schematically illustrating the structure of a thin film transistor according to an embodiment of the invention.

FIG. 1 is a cross-sectional view schematically illustrating the structure of a thin film transistor according to an embodiment of the invention. Referring to FIG. 1, the thin film transistor 100 of the present embodiment is adapted to be arranged on a substrate 110. The thin film transistor 100 includes a gate layer 120, an insulation layer 130, a carrier transmission layer 140, a passivation layer 150, a first source/drain layer 160a and a second source/drain layer 160b. In the present embodiment, the carrier transmission layer 140 includes an active layer 140a and a mobility enhancement layer 140b.

In detail, the gate layer 120, being as a bottom gate layer of the thin film transistor 100, is disposed on the substrate 110. When the gate layer 120 is subjected to a bias voltage, the gate layer 120 causes a carrier transmission channel within the active layer 140a, so as to provide a transmission means for carriers, such as electrons or electron holes. In the present embodiment, a material of the gate layer 120 is, for example, a metal material such as molybdenum (Mo), aluminum (Al) and titanium (Ti), an alloy thereof or a metal stack thereof. The insulation layer 130 is disposed on the gate layer 120 for blocking the active layer 140a and the gate layer 120, so as to avoid the two from being electrically connected. In the present embodiment, a material of the insulation layer 130 is, for example, a silicon oxide or a silicon nitride with high dielectric coefficient. The active layer 140a is disposed on the insulation layer 130. In the present embodiment, a material of the active layer 140a is, for example, a metal oxide semiconductor. Specifically, the material of the active layer 140a is, for example, indium zinc oxide, zinc oxide, aluminum-doped zinc oxide, indium gallium zinc oxide or a combination thereof.

Next, the passivation layer 150 is disposed on the active layer 140a, and covers a portion of the insulation layer 130 not covered by the active layer 140a. In the present embodiment, the thin film transistor 100 is a staggered thin film transistor; and therefore, in order to reduce an affect on the active layer 140a of the thin film transistor 100 in an etching process, the passivation layer 150 covers the active layer 140a with the larger area. Namely, the passivation layer 150, in a practical application, may avoid the layered structure of the thin film transistor 100 from being damaged in the fabrication process, and enhance a reliability thereof. In the present embodiment, the first source/drain layer 160a and the second source/drain layer 160b are disposed on the passivation layer 150, and are each connected with the active layer 140a through a contact hole W1, W2 located at the passivation layer 150. In the present embodiment, the contact holes W1, W2 are located at two sides above the active layer 140a and are being used as ohmic contacts for the source/drain layers and the gate layer. Namely, the thin film transistor 100 of the present embodiment has the source/drain structure that the contact holes W1, W2 are located at two sides of the thin film transistor 100, and the first source/drain layer 160a and the second source/drain layer 160b do not distribute in the island form.

In the present embodiment, the carrier transmission channel caused by the gate layer 120 within the active layer 140a is located between the first source/drain layer 160a and the second source/drain layer 160b for providing the transmission means to the carriers, such as electrons or electron holes. Herein, materials of the first source/drain layer 160a and the second source/drain layer 160b is, for example, a metal material such as molybdenum (Mo), aluminum (Al) and titanium (Ti), an alloy thereof or a metal stack thereof. In the practical application, the first source/drain layer 160a depends on a current flow direction to determine whether it is to be the source or the drain of the thin film transistor 100. If the current flows from the first source/drain layer 160a to the second source/drain layer 160b, then the first source/drain layer 160a is the drain of the thin film transistor 100 and the second source/drain layer 160b is the source of the thin film transistor 100. On the contrary, if the current flows from the second source/drain layer 160b to the first source/drain layer 160a, then the second source/drain layer 160b is the drain of the thin film transistor 100 and the first source/drain layer 160a is the source of the thin film transistor 100.

Moreover, in the present embodiment, the mobility enhancement layer 140b is disposed on the active layer 140a; herein, the mobility enhancement layer 140b is connected with the active layer 140a through the contact hole W3 above the active layer 140a. The contact hole W3 is located between the contact holes W1, W2 and is being used as an ohmic contact for the mobility enhancement layer 140b and the active layer 140a. In this structure, the mobility enhancement layer 140b is not connected with the first source/drain layer 160a and the second source/drain layer 160b.

In the present embodiment, the mobility enhancement layer 140b is at least used to enhance the carrier mobility of the active layer 140a. The mobility enhancement layer 140b of the present invention includes a first element with a smaller electronegativity. The active layer 140a includes a second element with a larger electronegativity. The first element of the mobility enhancement layer 140b forms a plurality of second element vacancies in the active layer 140a, so as to enhance the carrier mobility of the active layer. Taking the material of the active layer 140a, such as indium zinc oxide, zinc oxide, aluminum-doped zinc oxide, indium gallium zinc oxide or a combination thereof, for examples, the second element vacancies is, for instance, oxygen vacancies. Therefore, the selection of the first element of the mobility enhancement layer 140b, for example, may be an element with an electronegativity smaller than or equal to indium (In), gallium (Ga) or zinc (Zn), has a larger difference in electronegativity with oxygen, has a relatively stronger interatomic bond, and is capable of lowering a dynamic change of the oxygen vacancies therebetween the metal oxide semiconductor. In an implementation of the invention, the material of the active layer 140a is, for example, indium gallium zinc oxide (IGZO), and the material of the mobility enhancement layer 140b is, for example, calcium (Ca), which is capable of effectively improving the carrier mobility of the active layer of indium gallium zinc oxide.

In general, a method for the mobility enhancement layer 140b to enhance the carrier mobility of the active layer 140a includes increasing a carrier density of the active layer 140a and lowering a subgap density of the active layer 140a at a tail state. In terms of increasing the carrier density of the active layer 140a, a semiconductor material used as the active layer 140a has a bandgap structure including a valance band and a conduction band. If the carriers may smoothly transition from the valance band to the conduction band, then the carrier density of the semiconductor material may effectively be enhanced, thereby achieving an objective of enhancing the carrier mobility. On the other hand, as being the semiconductor material of the active layer 140a, in a bandgap structure thereof, defect states of many continuity tail states may be existed, and the subgap density may be used to measure an amount of the defects states in the bandgap structure. In the process of transitioning the carriers from the valance band to the conduction band, the defects forcibly capture the carrier, such that the carriers are unable to successfully transition from the valance band to the conduction band, and thus the carrier mobility of the active layer 140a tends to be low. Therefore, if the subgap density of the active layer 140a at the tail state is also lowered at the same time of increasing the carrier density of the active layer 140a, then the defects in the semiconductor material are reduced, such that the carriers may successfully transition from the valance band to the conduction band in order to achieve the objective of enhancing the carrier mobility.

Therefore, the mobility enhancement layer 140b of the present embodiment, for example, is floatingly connected at a back channel of the active layer 140a. The mobility enhancement layer 140b may achieve an objective of transitioning via increasing the carrier density of the active layer 140a or lowering the subgap density at the tail state. For example, taking the calcium of easy to form an oxygen compound and with an electronegativity of 1.00 as the mobility enhancement layer 140b, it may enhance the carrier mobility of the active layer 140a of IGZO from $10\ cm^2V^{-1}s^{-1}$ up to $80\ cm^2V^{-1}s^{-1}$.

In the present embodiment, the thin film transistor 100 has taken the structure of disposing the mobility enhancement layer 140b on the active layer 140a as an example for a purpose of description, but the invention is not limited thereto. In other embodiments, the active layer of the thin film transistor may also be disposed on the於 mobility enhancement layer.

Figure 2:
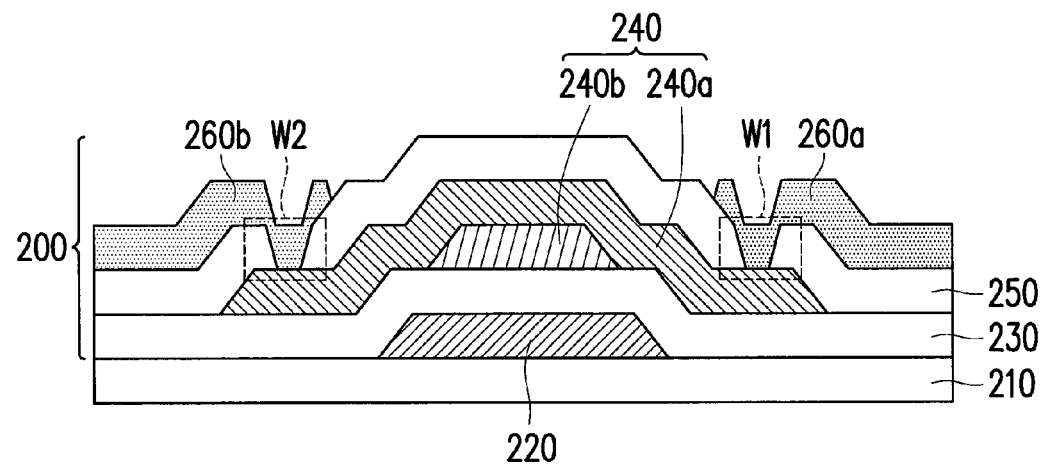
FIG. 2 to FIG. 4 are cross-sectional views schematically illustrating the structures of thin film transistors according to other embodiments of the invention.

FIG. 2 is a cross-sectional view illustrating the structure of a thin film transistor according to another embodiment of the invention. Referring to FIG. 1 and FIG. 2, a structure of the thin film transistor 200 of the present embodiment is similar to that of the thin film transistor 100 in FIG. 1, and a main difference between the two is, for example, that an active layer 240a of the thin film transistor 200 is disposed on a mobility enhancement layer 240b. In correspondence to this structure change, above the active layer 240a, there is no need to be disposed with the contact hole W3 as shown in FIG. 1. Moreover, a passivation layer 250 is also disposed on the mobility enhancement layer 240b; however, as seen from the cross-sectional view of FIG. 2, the passivation layer 250 is not directly connected with the mobility enhancement layer 240b.

Besides, the structure layout of the layers of the thin film transistor 200 described in this embodiment is as shown in FIG. 2, and the function of each layer is sufficiently taught, suggested, and embodied in the embodiments illustrated in FIG. 1. Therefore, no further description is provided herein.

In the embodiments illustrated in FIG. 1 and FIG. 2, the thin film transistors 100, 200 have taken the source/drain structure that contact holes are located at two sides of the thin film transistor as examples for a purpose of descriptions, but the invention is not limited thereto. In other embodiments, the sources/drains of the thin film transistors may also have the structures of island form.

Figure 3:
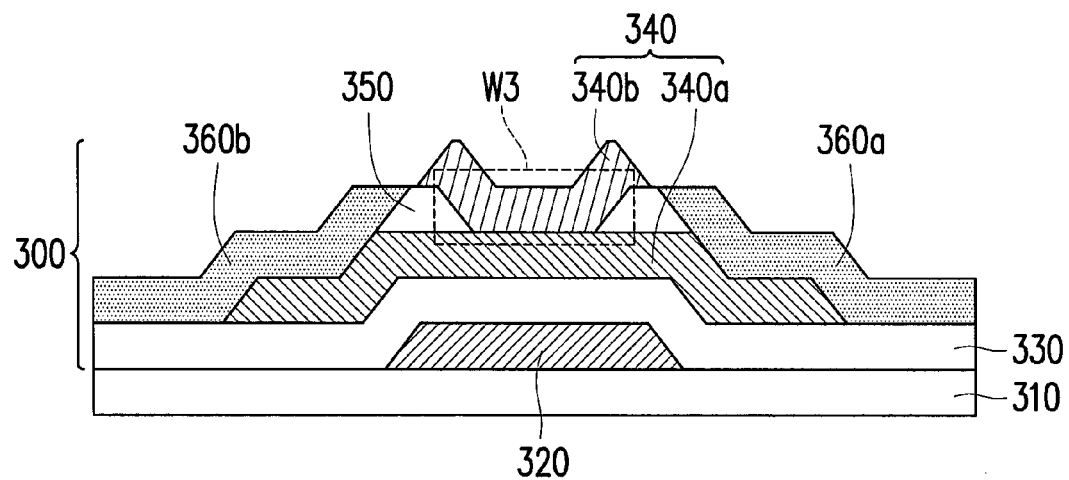

FIG. 3 is a cross-sectional view illustrating the structure of a thin film transistor according to yet another embodiment of the invention. Referring to FIG. 1 and FIG. 3, a structure of the thin film transistor 300 of the present embodiment is similar to that of the thin film transistor 100 in FIG. 1, and a main difference between the two is, for example, that a first source/drain layer 360a and a second source/drain layer 360b of the thin film transistor 300 are disposed on an active layer 340a and an insulation layer 330 with structures of island form, and are directly connected with the active layer 340a and the insulation layer 330. In correspondence to this structure change, above two sides of the active layer 340a, there is no need to be disposed with the contact holes W1, W2 as shown in FIG. 1.

Besides, the structure layout of the layers of the thin film transistor 300 described in this embodiment is as shown in FIG. 3, and the function of each layer is sufficiently taught, suggested, and embodied in the embodiments illustrated in FIG. 1. Therefore, no further description is provided herein.

In the present embodiment, the thin film transistor 300 has taken the structure of disposing the mobility enhancement layer 340b on the active layer 340a as an example for a purpose of description, but the invention is not limited thereto. In other embodiments, the active layer of the thin film transistor may also be disposed on the mobility enhancement layer.

Figure 4:
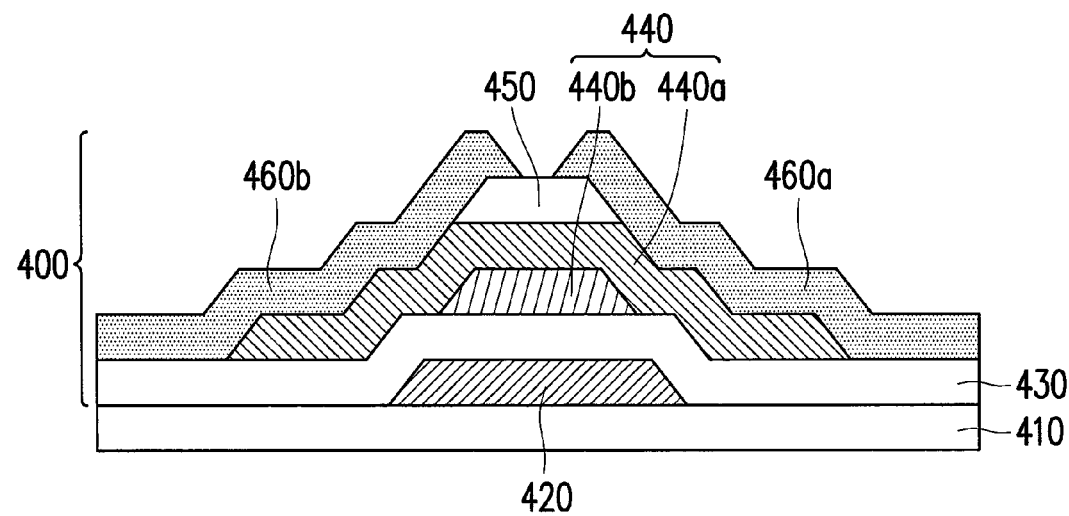

FIG. 4 is a cross-sectional view illustrating the structure of a thin film transistor according to still another embodiment of the invention. Referring to FIG. 3 and FIG. 4, a structure of the thin film transistor 400 of the present embodiment is similar to that of the thin film transistor 300 in FIG. 3, and a main difference between the two is, for example, that an active layer 440a of the thin film transistor 400 is disposed on a mobility enhancement layer 440b. In correspondence to this structure change, above the active layer 440a, there is no need to be disposed with the contact hole W3 as shown in FIG. 3. Furthermore, the passivation layer 450 is also disposed on the mobility enhancement layer 440b; however, as seen form the cross-sectional view of FIG. 4, the passivation layer 450 is not directly connected with the mobility enhancement layer 440b.

Besides, the structure layout of the layers of the thin film transistor 400 described in this embodiment is as shown in FIG. 4, and the function of each layer is sufficiently taught, suggested, and embodied in the embodiments illustrated in FIG. 1. Therefore, no further description is provided herein.

Figure 5:
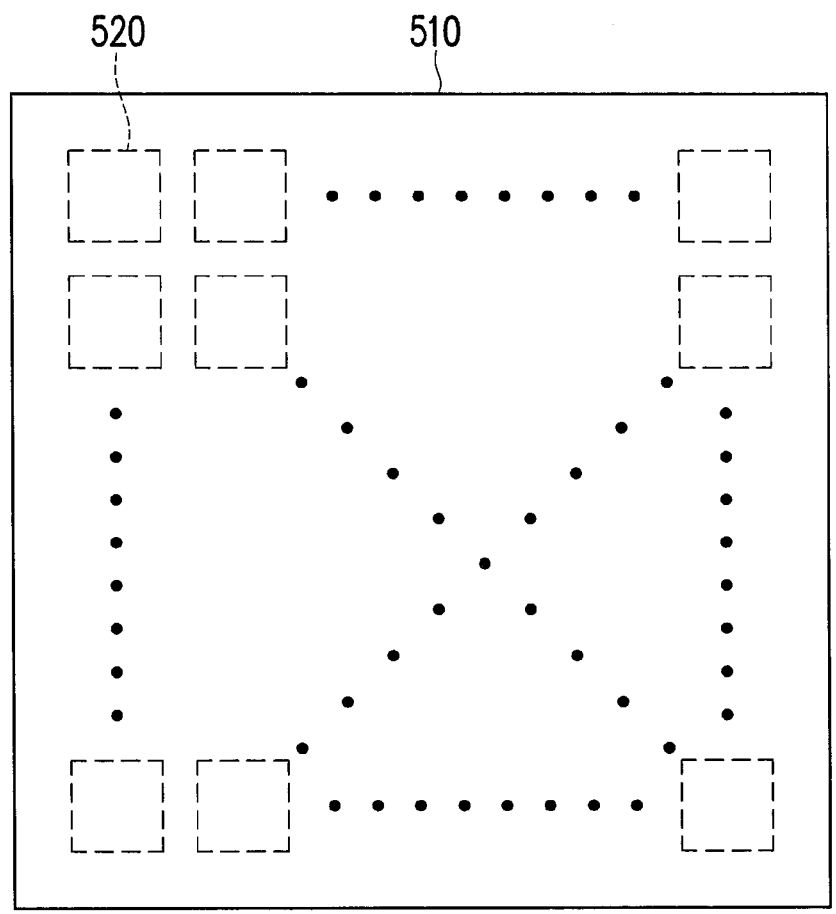
FIG. 5 is a top view schematically illustrating an array substrate according to an embodiment of the invention.

FIG. 5 is a top view schematically illustrating an array substrate according to an embodiment of the invention. Referring to FIG. 5, the array substrate 500 of the present embodiment includes a substrate 510 and a plurality of thin film transistors 520 arranged in array. Each thin film transistor is configured to display pixel data corresponded to each pixel unit of the array substrate 500. Structures of the thin film transistors 520 of the present embodiment, an implementation thereof is, for example, structure patterns disclosed in FIG. 1 to FIG. 4. It is noted that an amount and an arrangement of the thin film transistors on the array substrate 500 illustrated FIG. 5 are not intended to be used for limiting the invention.

Figure 6:
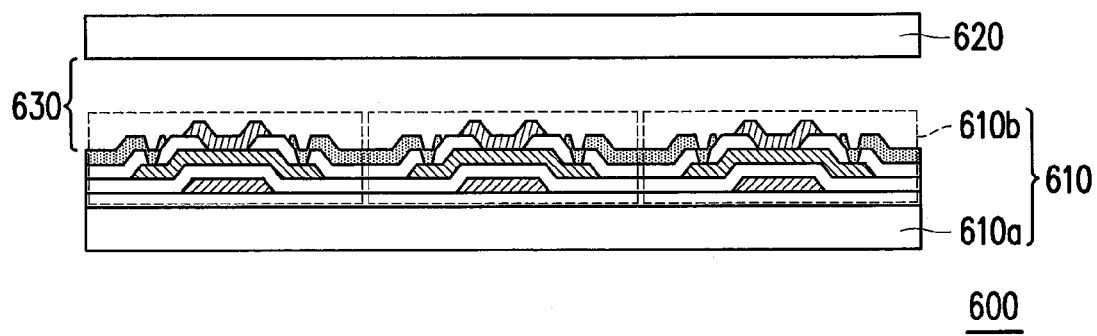
FIG. 6 is a cross-sectional view schematically illustrating a display device according to an embodiment of the invention.

FIG. 6 is a cross-sectional view schematically illustrating a display device according to an embodiment of the invention. Referring to FIG. 6, the display device 600 of the present embodiment includes an array substrate 610, an opposite substrate 620, a display layer 630 and a plurality of thin film transistors 610b. The opposite substrate 620 is arranged opposite to the array substrate 610. The display layer 630 is arranged between the array substrate 610 and the opposite substrate 620. The array substrate 610 has a substrate 610a and a plurality of thin film transistors 610b, wherein the thin film transistors 610b are arranged on the substrate 610a. Structures of the thin film transistors 610b of the present embodiment have taken the structure of the transistor disclosed in FIG. 1 as an example for the purpose of description, but the invention is not limited thereto. In other embodiments, the implementation of the thin film transistors 610b may also be the structure patterns disclosed in FIG. 2 to FIG. 4. It is noted that, an amount and an arrangement of the thin film transistors of the display device 600 illustrated in FIG. 6 are not intended to be used for limiting the invention.

In summary, in the embodiments of the invention, the thin film transistor has the mobility enhancement layer that is disposed above or below the active layer. During the practical operation, the element of low electronegativity within the mobility enhancement layer may form the element vacancies in the active layer, thereby enhancing the carrier mobility of the device.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A thin film transistor adapted to be arranged on a substrate, the thin film transistor comprising:
    a gate layer disposed on the substrate;
    an insulation layer disposed on the gate layer;
    a carrier transmission layer disposed on the insulation layer and comprising an active layer and a mobility enhancement layer;
    a passivation layer disposed on the active layer;
    a first source/drain layer disposed on the active layer and connected with the active layer; and
    a second source/drain layer disposed on the active layer and connected with the active layer,
    wherein in direction perpendicular to a normal line of a surface of the substrate, a length of the mobility enhancement layer is less than a length of the active layer, and then the mobility enhancement layer is not physically contacted with the first source/drain layer and the second source/drain layer,
    wherein the mobility enhancement layer is configures to enhance a carrier mobility of the active layer by forming a plurality of element vacancies in the active layer, the mobility enhancement layer comprises a first element, and an electronegativity of the first element is smaller than or equal to 1.81.

2. The thin film transistor as claimed in claim 1, wherein the active layer comprises a second element, and an electronegativity of the first element is smaller than an electronegativity of the second element, so that a carrier mobility of the active layer is enhanced.

3. The thin film transistor as claimed in claim 1, wherein the mobility enhancement layer is disposed on the active layer.

4. The thin film transistor as claimed in claim 1, wherein the first source/drain layer and the second source/drain layer are disposed on the passivation layer, and are each connected with the active layer through a contact hole located at the passivation layer.

5. The thin film transistor as claimed in claim 1, wherein the first source/drain layer and the second source/drain layer are disposed on the insulation layer, and are connected with the active layer and the insulation layer.

6. The thin film transistor as claimed in claim 1, wherein the active layer is disposed on the mobility enhancement layer.

7. The thin film transistor as claimed in claim 1, wherein the first element of the mobility enhancement layer is selected from one of four elements comprising indium, gallium, zinc and calcium.

8. The thin film transistor as claimed in claim 1, wherein a material of the active layer comprises a metal oxide semiconductor.

9. The thin film transistor as claimed in claim 8, wherein the active layer comprises a second element, and the second element is an oxygen element.

10. The thin film transistor as claimed in claim 8, wherein the metal oxide semiconductor comprises an indium zinc oxide, a zinc oxide, an aluminum-doped zinc oxide, an indium gallium zinc oxide or a combination thereof.

11. An array substrate comprising:
    a substrate; and
    a plurality of thin film transistors arranged on the substrate, each of the thin film transistors comprising:
    a gate layer disposed on the substrate;
    an insulation layer disposed on the gate layer;
    a carrier transmission layer disposed on the insulation layer, and comprising an active layer and a mobility enhancement layer;
    a passivation layer disposed on the active layer;
    a first source/drain layer disposed on the active layer and connected with the active layer; and
    a second source/drain layer disposed on the active layer and connected with the active layer,
    wherein in a direction perpendicular to a normal line of a surface of the substrate, a length of the mobility enhancement layer is less than a length of the active layer, and then the mobility enhancement layer is not physically contacted with the first source/drain layer and the second source/drain layer,
    wherein the mobility enhancement layer is configured to enhancement a carrier mobility of the active layer by forming a plurality of element vacancies in the active layer.

12. The array substrate as claimed in claim 11, wherein the mobility enhancement layer comprises a first element, the active layer comprises a second element, and an electronegativity of the first element is smaller than an electronegativity of the second element, so that a carrier mobility of the active layer is enhanced.

13. The array substrate as claimed in claim 11, wherein the mobility enhancement layer is disposed on the active layer.

14. The array substrate as claimed in claim 11, wherein the active layer is disposed on the mobility enhancement layer.

15. The array substrate as claimed in claim 11, wherein the mobility enhancement layer comprises a first element, and an electronegativity of the first element is smaller than or equal to 1.81.

16. A display device comprising:
    an array substrate having a substrate and a plurality of thin film transistors, wherein the thin film transistors are arranged on the substrate, and each of the thin film transistors comprises:
    a gate layer disposed on the array substrate;
    an insulation layer disposed on the gate layer;
    a carrier transmission layer disposed on the insulation layer, and comprising an active layer and a mobility enhancement layer;
    a passivation layer disposed on the active layer;
    a first source/drain layer disposed on the active layer and connected with the active layer; and
    a second source/drain layer disposed on the active layer and connected with the active layer;
    wherein in a direction perpendicular to a normal line of a surface of the substrate, a length of the mobility enhancement layer is less than a length of the active layer, and then the mobility enhancement layer is not physically contacted with the first source/drain layer and the second source/drain layer,
    wherein the mobility enhancement layer is configured to enhance a carrier mobility of the active layer by forming a plurality of element vacancies in the active layer;
    an opposite substrate arranged opposite to the array substrate; and
    a display layer arranged between the array substrate and the opposite substrate.

17. The display device a recited in claim 16, wherein the mobility enhancement layer comprises a first element, the active layer comprises a second element, and an electronegativity of the first element is smaller than an electronegativity of the second element, so that a carrier mobility of the active layer is enhanced.

18. The display device as claimed in claim 16, wherein the mobility enhancement layer is disposed on the active layer.

19. The display device as claimed in claim 16, wherein the active layer is disposed o the mobility enhancement layer.

20. The display device as claimed in claim 16, wherein the mobility enhancement layer comprises a first element, and an electronegativity of the first element is smaller than or equal to 1.81.

* * * * *